United States Patent
Bollenbeck et al.

(10) Patent No.: US 9,903,926 B2
(45) Date of Patent: Feb. 27, 2018

(54) DETERMINATION OF COMMUNICATION LATENCY IN MAGNETIC RESONANCE TOMOGRAPHY SYSTEMS

(71) Applicants: Jan Bollenbeck, Eggolsheim (DE); Stefan Schwarzer, Taufkirchen (DE); Markus Vester, Nürnberg (DE)

(72) Inventors: Jan Bollenbeck, Eggolsheim (DE); Stefan Schwarzer, Taufkirchen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1166 days.

(21) Appl. No.: 13/924,861

(22) Filed: Jun. 24, 2013

(65) Prior Publication Data

US 2013/0342199 A1 Dec. 26, 2013

(30) Foreign Application Priority Data

Jun. 26, 2012 (DE) .................. 10 2012 210 827

(51) Int. Cl.
*G01R 33/36* (2006.01)
(52) U.S. Cl.
CPC .................. *G01R 33/3692* (2013.01)
(58) Field of Classification Search
CPC .................................. G01R 33/3692
See application file for complete search history.

(56) References Cited

U.S. PATENT DOCUMENTS

| | | | |
|---|---|---|---|
| 6,937,016 B2* | 8/2005 | Wang | G01R 33/3621 324/318 |
| 7,098,659 B2* | 8/2006 | Reykowski | G01R 33/54 324/309 |
| 7,538,554 B2 | 5/2009 | Wendt | |
| 7,846,157 B2* | 12/2010 | Kozel | A61B 5/0422 600/374 |
| 8,085,048 B2 | 12/2011 | Biber et al. | |
| 8,148,983 B2 | 4/2012 | Biber | |

(Continued)

FOREIGN PATENT DOCUMENTS

| | | |
|---|---|---|
| CN | 1890577 A | 1/2007 |
| CN | 101539614 A | 9/2009 |

(Continued)

OTHER PUBLICATIONS

Chinese Office action for related Chinese Application No. 201310239002.1, dated Dec. 30, 2015, with English Translation.

(Continued)

*Primary Examiner* — Dixomara Vargas
(74) *Attorney, Agent, or Firm* — Lempia Summerfield Katz LLC

(57) ABSTRACT

A method for determining communication latency in a magnetic resonance tomography system includes emitting a high-frequency pulse at a first timepoint, receiving the high-frequency pulse by a local coil arrangement of the magnetic resonance tomography system, and transmitting a return signal from the local coil arrangement to a receiving unit. The method also includes receiving the return signal by the receiving unit at a second timepoint, and evaluating a time difference between the first timepoint and the second timepoint in order to determine the communication latency.

17 Claims, 2 Drawing Sheets

(56) References Cited

U.S. PATENT DOCUMENTS

| | | | |
|---|---|---|---|
| 8,548,560 B2 * | 10/2013 | Saes | G01R 33/3621 |
| | | | 600/407 |
| 8,901,928 B2 * | 12/2014 | Alexiuk | G01R 33/288 |
| | | | 324/318 |
| 9,136,980 B2 * | 9/2015 | Baheti | H03M 7/30 |
| 2002/0180437 A1 | 12/2002 | Reykowski et al. | |
| 2007/0013376 A1 | 1/2007 | Heid et al. | |
| 2007/0268018 A1 | 11/2007 | Wendt et al. | |
| 2009/0237081 A1 | 9/2009 | Biber et al. | |
| 2010/0033180 A1 | 2/2010 | Biber et al. | |

FOREIGN PATENT DOCUMENTS

| | | |
|---|---|---|
| CN | 101644750 A | 2/2010 |
| DE | 10 2008 014 751 A1 | 10/2009 |
| JP | 2005118460 A | 5/2005 |

OTHER PUBLICATIONS

German Office Action dated Feb. 28, 2013 for corresponding German Patent Application No. DE 10 2012 210 827.0 with English translation.

* cited by examiner

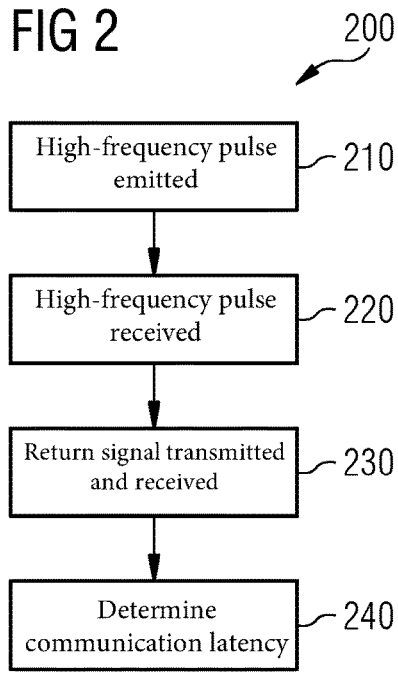
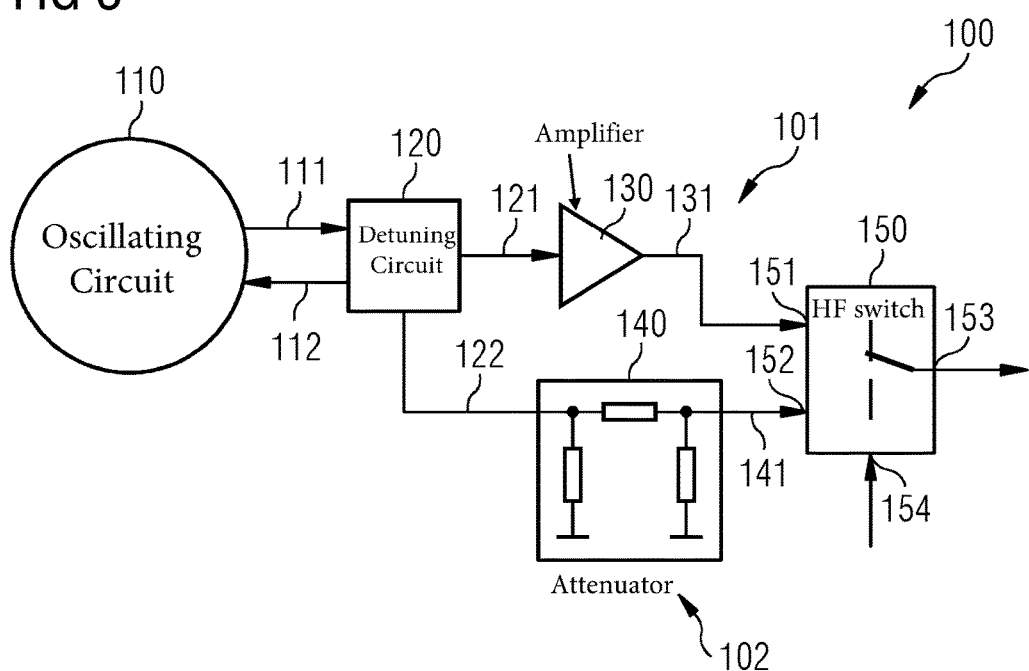

DETERMINATION OF COMMUNICATION LATENCY IN MAGNETIC RESONANCE TOMOGRAPHY SYSTEMS

RELATED APPLICATIONS

This application claims the benefit of German Patent Application No. DE 102012210827.0, filed Jun. 26, 2012, the entire contents of which are hereby incorporated herein by reference.

TECHNICAL FIELD

The present teachings relate generally to methods for determining communication latency in magnetic resonance tomography systems, receiving systems for local coil arrangements of magnetic resonance tomography systems, and magnetic resonance tomography systems with a local coil arrangement.

BACKGROUND

Magnetic resonance tomography systems provide diagnostic imaging for medical purposes. Magnetic resonance tomography uses the dependence of the relaxation times of excited nuclear spins on the environment of atomic nuclei to obtain information about the spatial arrangement of different types of tissue.

Magnetic resonance tomography systems may be equipped with local coil arrangements that serve to increase the sensitivity of the magnetic resonance tomography system in certain local areas. Such local coil arrangements may be designed for wireless transmission of data ascertained by the local coil arrangement. Wireless data transmission may result in a variable latency time.

DE 10 2008 014 751 A1 describes an arrangement for detuning a receiving antenna in a local coil of a magnetic resonance tomography system.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a method for determining communication latency in a magnetic resonance tomography system is provided. In some embodiments, an improved receiving system for a local coil arrangement of a magnetic resonance tomography system is provided. In some embodiments, a magnetic resonance tomography system with a local coil arrangement is provided with a receiving system.

BRIEF DESCRIPTION OF THE DRAWINGS

FIG. 2 shows a schematic flow chart of an exemplary method for determining communication latency.

FIG. 3 shows a schematic block diagram of an exemplary receiving system of a local coil arrangement of an exemplary magnetic resonance tomography system.

DETAILED DESCRIPTION

Figure 1:
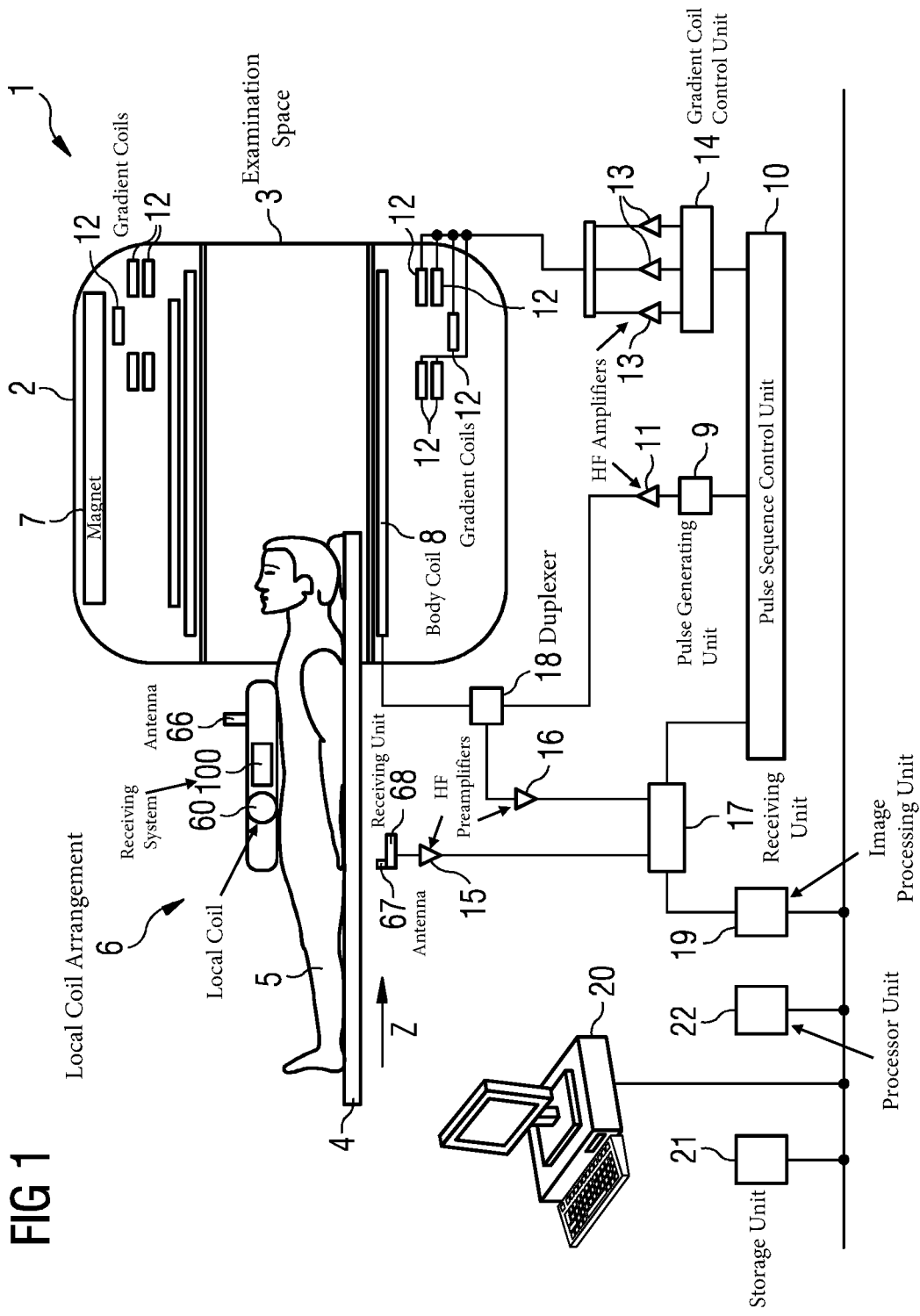
FIG. 1 shows a schematic diagram of an exemplary magnetic resonance tomography system.

A method for determining communication latency in a magnetic resonance tomography system in accordance with the present teachings includes transmitting a high-frequency pulse at a first timepoint, receiving the high-frequency pulse by a local coil arrangement of the magnetic resonance tomography system, and transmitting a return signal from the local coil arrangement to a receiving unit. The method also includes receiving the return signal by the receiving unit at a second timepoint, and evaluating a time difference between the first timepoint and the second timepoint to determine the communication latency. In some embodiments, all of the components of the transmit and receive paths of the magnetic resonance tomography system form a measuring chain and are taken into account in determining the communication latency. In some embodiments, recordation of all kinds of partial latencies is provided. In some embodiments, consideration of individual-component (e.g., exemplar-dependent) scattering of partial latencies is provided. Greater individual-component scattering is tolerated, thus reducing the manufacturing costs of manufacturing a magnetic resonance tomography system.

In some embodiments, an oscillating circuit of the local coil arrangement is detuned before reception of the high-frequency pulse. The high-frequency pulse may then have high field strength without a receiving system of the local coil arrangement being overridden.

In some embodiments, the high-frequency pulse that is received is digitized by the local coil arrangement to obtain a digital signal. The digital signal is then transmitted as a return signal. The digitizing of the received high-frequency pulse by the local coil arrangement provides loss-free transmission of the digital signal to the receiving unit of the magnetic resonance tomography system.

In some embodiments, the return signal is transmitted wirelessly from the local coil arrangement to the receiving unit. Obtrusive cables between the local coil arrangement and the receiving unit may thus be dispensed with. Through the determination of communication latency in accordance with the present teachings, the wireless transmission of the return signal may take place with high transmission quality.

In some embodiments, the time difference is ascertained by correlating the high-frequency pulse and the return signal in the time domain. Communication latencies in the microsecond range may be thus ascertained.

In some embodiments, the time difference is ascertained by correlating the high-frequency pulse and the return signal in the frequency range. Communication latencies in the nanosecond range may be thus determined.

In some embodiments, the high-frequency pulse is emitted by a body coil of the magnetic resonance tomography system. An additional coil is thus not used for the emission of the high-frequency pulse. A method is provided that takes into consideration properties of the body coil and all the components for the control of the body coil when determining the communication latency.

In some embodiments, a Larmor precession is stimulated by the high-frequency pulse. The high-frequency pulse may then serve as a spin-stimulating transmission pulse at the same time. As a result, performance of the method does not require additional time.

In some embodiments, the high-frequency pulse is used to ascertain a Larmor frequency. The method may be performed at the same time as the determination of the Larmor frequency that is done anyway. As a result, the method does not increase the total time required for an examination by the magnetic resonance tomography system.

A receiving system in accordance with the present teachings for a local coil arrangement of a magnetic resonance tomography system includes an oscillating circuit for receipt of a high-frequency pulse. The receiving system further includes a first signal path and a second signal path. Each of the first signal path and the second signal path is configured to process a signal received by the oscillating circuit. The second signal path is configured to process a signal with greater signal strength than the first signal path. In some embodiments, the receiving system is suitable for receiving signals with a low signal strength. In some embodiments, the receiving system is suitable for receiving signals with a high signal strength without the receiving system being under-ridden or overridden. As a result, the receiving system may be used to perform regular measurements of the magnetic resonance tomography system as well as to determine communication latency in the magnetic resonance tomography system.

In some embodiments, the receiving system includes a detuning circuit to detune the oscillating circuit. The detuning circuit is thus configured to detune the oscillating circuit before reception of a signal with high signal strength. As a result, the receiving system is suitable for the reception of signals of even higher signal strength.

In some embodiments, the receiving system includes an HF switch that is configured to forward a signal supplied by either the first signal path or by the second signal path to a subsequent part of the circuit of the receiving system. The subsequent parts of the circuit may then be used to process signals supplied via the first signal path as well as to process signals supplied via the second signal path. As a result, the subsequent parts of the circuit may serve to perform regular measurements of the magnetic resonance tomography system and to determine the communication latency of the magnetic resonance tomography system. The subsequent parts of the circuit of the receiving system are also taken into consideration when determining the communication latency. As a result, exemplar-dependent scattering of latency times of the subsequent parts of the circuit of the receiving system may be offset.

In some embodiments, the first signal path of the receiving system includes an amplifier. The amplifier may serve to amplify signals with low signal strength.

In some embodiments, the second signal path of the receiving system includes an attenuator. The attenuator may serve to attenuate signals with high signal strength.

A magnetic resonance tomography system in accordance with the present teachings includes a local coil arrangement with a receiving system, as described above. In some embodiments, the receiving system is suitable for determining the communication latency of the magnetic resonance tomography system.

FIG. 1 shows a schematic representation of an exemplary magnetic resonance tomography system 1. The magnetic resonance tomography system 1 may be used for medical diagnosis. For example, the magnetic resonance tomography system may be used to produce cross-sections of a human or animal body.

The magnetic resonance tomography system 1 has a whole-body coil 2 with an examination space 3. In some embodiments, the examination space 3 is of a tubular design, as shown, and receives a patient 5 on an examination table 4. The patient 5 may be moved into the examination space 3 by moving the examination table 4 so that images of the body of the patient 5 may be made.

For the imaging examination of the patient 5, a strong static magnetic field is to be generated in the examination space 3. As a result, energy degeneration between different orientations of the magnetic moments of the atomic nuclei of the body of the patient 5 is cancelled out. The whole-body coil 2 of the magnetic resonance tomography system 1 includes a magnet 7 for this purpose. In some embodiments, the magnet 7 may, for example, be designed as a superconducting magnet. In some embodiments, the magnet 7 may, for example, be designed to generate a static magnetic field with a strength of between about 0.2 tesla and about 3 tesla. In some embodiments, the magnet 7 may also be designed to generate even stronger magnetic fields. The magnetic field generated by the magnet 7 may be approximately homogenous in the area of the examination space 3.

Under the influence of the static magnetic field generated by the magnet 7, the nuclear spins of the atomic nuclei of the body of the patient 5 precess around the axis predefined by the magnetic field (e.g., Larmor precession). By radiating an alternating magnetic field vertically aligned to the static magnetic field with a resonance frequency, the nuclear spins of the atoms of the body of the patient 5 may be deflected (e.g., excited) with phase synchronicity.

The whole-body coil 2 has a high-frequency antenna for this purpose, shown in FIG. 1 as a body coil 8. The body coil 8 is suitable for radiating high-frequency magnetic impulses. High frequency excitation pulses are generated by a pulse generating unit 9 that is controlled by a pulse sequence control unit 10. After amplification of the high-frequency excitation pulses by an HF amplifier 11, the high-frequency excitation pulses are routed to the body coil 8 and emitted via a duplexer 18. The high frequency system described is only shown schematically in FIG. 1. In some embodiments, more than one pulse generating unit 9, more than one HF amplifier 11, and additional high-frequency antennas in addition to the body coil 8 may be provided.

To generate cross-sections of the body of the patient 5, the homogenous magnetic field generated by the magnet 7 is varied depending on the location. The magnetic resonance tomography system 11 has one or more gradient coils 12 for this purpose. During a measurement performed by the magnetic resonance tomography system 1, the gradient coils 12 may generate magnetic gradient fields for selective layer excitation and for local encoding of a measurement signal. The gradient coils 12 are controlled by a gradient coil control unit 15 that is connected to the gradient coils 12 via additional HF amplifiers 13. The gradient coil control unit 14 is controlled by the pulse sequence control unit 10.

After switching off the alternating magnetic field radiated by the body coil 8, the nuclear spins excited by the alternating magnetic field relax after a characteristic relaxation period and emit signals that may be received by the body coil 8. The signals received by the body coil 8 are routed via the duplexer 18 to an HF preamplifier 16, amplified by the HF preamplifier 16, and transmitted to a receiving unit 17.

The receiving unit 17 processes the received signals. For example, the receiving unit 17 may digitize the received signals. An image of the body of the patient 5 may be reconstructed from the data received by the receiving unit 17 using mathematical methods. The selected images are processed by an image processing unit 19 and may be displayed, for example, via a control console 20 or saved in a storage unit 21. A processor unit 22 controls these sequences.

In some embodiments, the magnetic resonance tomography system 1 also includes a local coil arrangement 6 that increases the sensitivity of the magnetic resonance tomography system 1 in a local area. In some embodiments, the magnetic resonance tomography system 1 may generate especially descriptive images of the local area. The local coil arrangement 6 includes a receiving system 100 with a local coil 60 that serves to receive signals emitted by the excited nuclear spins of the atoms of the body of the patient 5.

In the representative embodiment shown in FIG. 1, the local coil arrangement 6 is configured to transmit the signals received by the local coil arrangement 6 wirelessly to the receiving unit 17. An advantage of wireless transmission is that no obtrusive cables are used between the local coil arrangement 6 and the receiving unit 17, thereby increasing the flexibility of the local coil arrangement 6. However, in some embodiments, the signals received by the local coil arrangement 6 may be transmitted to the receiving unit 17 by cable.

In some embodiments, the local coil arrangement 6 has an antenna 66 to transmit the data. A receiving unit 68 of the magnetic resonance tomography system 1 has an antenna 67 configured to receive the signals emitted by the antenna 66 of the local coil arrangement 6. An HF preamplifier 15 amplifies the signals received by the antenna 67 of the receiving unit 68 and forwards the signals to the receiving unit 17. The signals are processed together in the receiving unit 17 with the signals detected by the body coil 8.

During transmission of the signals received by the local coil arrangement 6 to the receiving unit 68, variable chronological latencies may occur. In some embodiments, the transmission methods used may, for example, include methods for collision avoidance that involve the retransmission of lost data packets during data transmission. In some embodiments, whether the transmission of the data from the local coil arrangement 6 to the receiving unit 68 takes place using digital or analog technology is irrelevant. In some embodiments, the problem may occur both with wireless and wired transmission of data between the local coil arrangement 6 and the receiving unit 68. In some embodiments, variations in latencies that arise may be in the range of several microseconds.

In some embodiments, manufacturing tolerances stemming from the manufacture of the local coil arrangement 6 may also lead to variations in latency times during data transmission between the local coil arrangement 6 and the receiving unit 68.

In the case of wireless data transmission between the local coil arrangement 6 and the receiving unit 68, a further source of variations in latency times during data transmission is the variable distance between the local coil arrangement 6 and the fixed receiving unit 68. In the example shown in FIG. 1, the local coil arrangement 6 is, for example, placed on the chest of the patient 5. As a result of movements by the patient 5, or as a result of the breathing of the patient 5, the position of the local coil arrangement 6 changes in relation to the receiving unit 68 depending on the time. The time-dependent distance between the local coil arrangement 6 and the receiving unit 68 produces a time-dependent variable propagation time in the radio signals transmitted between the antenna 66 of the local coil arrangement 6 and the antenna 67 of the receiving unit 68. These variations in the propagation time may be in the range of several nanoseconds and may bring about a variation in the phase relationship of the signals received by the receiving unit 68.

In some embodiments, for reliable data transmission despite the above-described variations in latency times that may occur during data transmission from the local coil arrangement 6 to the receiving unit 68, the current latency time is to be determined. The magnetic resonance tomography system 1 is thus configured to perform a method 200 to determine this communication latency. In some embodiments, the communication latency is metrologically determined (e.g., before each imaging measurement of the magnetic resonance tomography system 1). FIG. 2 shows a schematic flow chart of an exemplary method 200.

In act 210, a high-frequency pulse is emitted at a first timepoint. The high-frequency pulse is emitted by a component of the magnetic resonance tomography system suitable for the emission of HF power. In some embodiments, the high-frequency pulse is emitted by the body coil 8 provided for the emission of high-frequency pulses. As a result, any latency variations caused by the body coil 8 are also taken into consideration when determining the communication latency.

In act 220, the high-frequency pulse emitted is received by the local coil arrangement 6.

In act 230, a return signal is transmitted by the local coil arrangement 6 to the receiving unit 68 of the magnetic resonance tomography system 1. The return signal is received by the receiving unit 68 at a second timepoint. The return signal constitutes a representation of the high-frequency pulse received by the local coil arrangement 6 in the act 220. In some embodiments, the high-frequency pulse received may, for example, be digitized by the local coil arrangement 6 to receive a digital signal. The digital signal may be transmitted to the receiving unit 68 as a return signal in the act 230. However, in some embodiments, the high-frequency pulse received may be transmitted in analog form as a return signal to the receiving unit 68 in the act 230.

In some embodiments, the transmission of the return signal in the act 230 takes place wirelessly via the antenna 66 of the local coil arrangement 6 and the antenna 67 of the receiving unit 68. However, in some embodiments, the method 200 is also suitable for wired data transmission between the local coil arrangement 6 and the receiving unit 68.

In act 240, a time difference between the first timepoint and the second timepoint is evaluated to determine the communication latency. The first timepoint and the second timepoint may be ascertained by a correlation of the high-frequency pulse emitted and the return signal received in the time domain. In some embodiments, a large latency time in the range of microseconds may be ascertained in this way. Alternatively, the high-frequency pulse emitted and the return signal received may also be correlated in the frequency range to ascertain a communication latency in the nanosecond range that is manifested as a phase shift. In some embodiments, both correlations are performed.

In some embodiments, the method 200 to determine the communication latency may also be performed several times during a measurement undertaken by the magnetic resonance tomography system 1. Such multiple performances may be useful, for example, if the local coil arrangement 6 changes as a result of the breathing of the patient 5 or as a result of moving the examination table 4 during a measurement undertaken by the magnetic resonance tomography system.

In some embodiments, the magnetic resonance tomography system 1 may also have several local coil arrangements. In some embodiments, the communication latency for each of these local coil arrangements may be determined. In some embodiments, the individual communication latencies are determined at the same time using only one high-frequency pulse emitted by the magnetic resonance tomography system 1.

In some embodiments, the high-frequency pulse emitted in the act 210 is a high-frequency pulse emitted by the magnetic resonance tomography system 1 for the performance of an imaging measurement. For example, the high-frequency pulse emitted in act 210 may be a pulse to ascertain the Larmor frequency of hydrogen. In some embodiments, the high-frequency pulse emitted in act 210 may also be the high-frequency pulse emitted for nuclear spin excitation of the atoms of the body of the patient 5. As a result, additional time is not necessary to perform the method 200 during the course of an imaging measurement performed by the magnetic resonance tomography system 1.

In some embodiments, a high-frequency pulse emitted by the body coil 8 that has a significantly higher pulse strength than the signals emitted by the nuclear spins of the atoms of the body of the patient 5 may be received by the local coil arrangement 6. The reception by the local coil arrangement 6 of a high-frequency pulse emitted by the body coil 8 may therefore override the receiving system 100 of the local coil arrangement 6. In some embodiments, preventing the receiving system 100 from being overridden provides for a reliable reception of the high-frequency pulse by the local coil arrangement 6 in the act 220.

In some embodiments, the overriding of the receiving system 100 of the local coil arrangement 6 may be prevented by reducing the pulse power of the high-frequency pulse emitted by the body coil 8 in the act 210. In some embodiments, this reduction in pulse power may take place by reducing the amplifier power of the HF amplifier 11 or by completely bypassing the HF amplifier 11. In such a way, the high-frequency pulse emitted by the body coil 8 may have a lower field strength. However, the high-frequency pulse emitted by the body coil 8 may not then be used at the same time for other adjustments and measurements or for excitation of the nuclear spins of the atoms of the body of the patient 5.

In other embodiments, the overriding of the receiving system 100 of the local coil arrangement 6 may be avoided by adjusting the receiving system 100 to the high field strength of the high-frequency pulse before reception of the high-frequency pulse in the act 220. In some embodiments, the field strength of the high-frequency pulse emitted in the act 210 may remain unchanged.

FIG. 3 shows a schematic block diagram of an exemplary receiving system 100. The receiving system 100 is configured to receive high-frequency pulses with a high field strength in the act 220 without ceasing linear operation (e.g., without being overridden in the process). The receiving system 100 is further configured to receive signals with a low field strength emitted by the nuclear spins during normal operation of the magnetic resonance tomography system.

In some embodiments, the receiving system 100 includes an oscillating circuit 110 that is configured for reception of the respective high-frequency signal. In some embodiments, the oscillating circuit 110 may include the local coil 60. The receiving system 100 also includes a detuning circuit 120. The detuning circuit 120 is provided to detune the oscillating circuit 110 using a detuning signal 112. To receive the signals emitted by the nuclear spins during a standard measurement, the oscillating circuit 110 remains untuned (e.g., tuned to the frequency of the signal to be received). Before reception of the high-frequency pulse emitted by the body coil 8 in the act 220 of the method 200, the oscillating circuit 110 is detuned by the detuning circuit 120. As a result, the high-frequency pulse with a high field strength received in the act 220 only excites one oscillation with a reliable amplitude in the oscillating circuit 110.

In some embodiments, the receiving system 100 further includes a first signal path 101 and a second signal path 102. The first signal path 101 and the second signal path 102 are each configured to process the receive signal 111 received by the oscillating circuit 110. The first signal path 101 is configured for processing receive signals 111 with a low signal strength. The second signal path 102 is configured for processing receive signals 111 with a high signal strength.

The first signal path 101 includes an amplifier 130 configured to receive the receive signal 111 from the oscillating circuit 110 as a receive signal 121 of a detuning circuit 120. The amplifier 130 is further configured to amplify and forward the receive signal 121 as an amplified signal 131 to an HF switch 150. In some embodiments, the amplifier 130 may be an LNA amplifier.

The second signal path 102 includes an attenuator 140 that, in some embodiments, may be configured as a resistive attenuator. The attenuator 140 is configured to decouple and attenuate part of the receive signal 111 received from the oscillating circuit 110 as a decoupled signal 122 from the detuning circuit 120, and to supply the decoupled signal 122 to the HF switch 150 as an attenuated signal 141. If the signal 122 decoupled on the detuning circuit 120 is already sufficiently weak, the attenuator 140 may be omitted.

The HF switch 150 receives the amplified signal 131 via a first input 151 and receives the attenuated signal 141 via a second input 152. The HF switch 150 is configured, depending on a control signal present at a control signal input 154, to either switch through the signal at the first input 151 or switch through the signal at the second input 152 to an output 153. At the output 153, the HF switch 150 is configured to forward the signal to subsequent circuit elements of the receiving system 100. To prevent self-excitation of the amplifier 130, the HF switch 150 is configured, in some embodiments, to provide a suitable load impedance of, for example, 50 Ohm at the first input 151, while the second input 152 is switched through to the output 153.

The first signal path 101 and the second signal path 102 have a time-invariant and largely load-independent transmission phase difference. The transmission phase difference may be ascertained before startup of the magnetic resonance tomography system 1 and taken into consideration as a correction characteristic when determining the communication latency.

After determination of the communication latency by the method 200, the ascertained communication latency may be taken into consideration during further imaging measurements performed by the magnetic resonance tomography system.

Although the invention was illustrated and described in reference to exemplary embodiments, the invention is not limited by the disclosed examples. Other variations may be derived therefrom by a person skilled in the art without departing from the scope of protection of the invention.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A method for determining a communication latency in a magnetic resonance tomography system, the method comprising:
   emitting, by a coil of the magnetic resonance tomography system, a high-frequency pulse at a first timepoint;
   receiving the high-frequency pulse by a local coil arrangement of the magnetic resonance tomography system;
   detuning an oscillating circuit of the local coil arrangement during the receiving of the high-frequency pulse;
   transmitting a return signal from the local coil arrangement to a receiving unit of the magnetic resonance tomography system;
   receiving the return signal by the receiving unit at a second timepoint; and
   evaluating a time difference between the first timepoint and the second timepoint to determine the communication latency.

2. The method of claim 1, further comprising digitizing the high-frequency pulse by the local coil arrangement to obtain a digital signal that is transmitted as the return signal.

3. The method of claim 1, further comprising digitizing the high-frequency pulse by the local coil arrangement to obtain a digital signal that is transmitted as the return signal.

4. The method of claim 1, wherein the transmitting of the return signal from the local coil arrangement to the receiving unit comprises a wireless transmission.

5. The method of claim 1, wherein the transmitting of the return signal from the local coil arrangement to the receiving unit comprises a wireless transmission.

6. The method of claim 3, wherein the transmitting of the return signal from the local coil arrangement to the receiving unit comprises a wireless transmission.

7. The method of claim 1, further comprising correlating the high-frequency pulse and the return signal in a time domain to ascertain the time difference.

8. The method of claim 1, further comprising correlating the high-frequency pulse and the return signal in a frequency range to ascertain the time difference.

9. The method of claim 1, wherein the coil is a body coil of the magnetic resonance tomography system.

10. The method of claim 1, further comprising stimulating a Larmor precession with the high-frequency pulse.

11. The method of claim 1, further comprising ascertaining a Larmor frequency using the high-frequency pulse.

12. A receiving system for a local coil arrangement of a magnetic resonance tomography system, the receiving system comprising:
   an oscillating circuit configured for reception of a high-frequency pulse generated by a coil at a distance from the local coil arrangement;
   a first signal path and a second signal path, wherein each of the first signal path and the second signal path is configured to process a signal received by the oscillating circuit; and
   a detuning circuit configured to detune the oscillating circuit during the reception of the high-frequency pulse generated by the coil at the distance from the local coil arrangement,
   wherein the second signal path is configured to process a signal with higher signal strength than the first signal path.

13. The receiving system of claim 12, further comprising an HF switch configured to forward a signal supplied by either the first signal path or the second signal path to a subsequent part of the receiving system.

14. The receiving system of claim 12, further comprising an HF switch configured to forward a signal supplied by either the first signal path or the second signal path to a subsequent part of the receiving system.

15. The receiving system of claim 12, wherein the first signal path comprises an amplifier.

16. The receiving system of claim 12, wherein the second signal path comprises an attenuator.

17. A magnetic resonance tomography system comprising:
   a local coil arrangement comprising a receiving system, wherein the receiving system comprises:
      an oscillating circuit configured for reception of a high-frequency pulse generated by a coil at a distance from the local coil arrangement;
      a first signal path and a second signal path, wherein each of the first signal path and the second signal path is configured to process a signal received by the oscillating circuit; and
      a detuning circuit configured to detune the oscillating circuit during the reception of the high-frequency pulse generated by the coil at the distance from the local coil arrangement,
   wherein the second signal path is configured to process a signal with higher signal strength than the first signal path.

* * * * *